United States Patent [19]

Park

[11] Patent Number: 5,668,043

[45] Date of Patent: Sep. 16, 1997

[54] METHOD FOR FORMING ISOLATED REGIONS IN A SEMICONDUCTOR DEVICE

[75] Inventor: Sang Hoon Park, Kyoungkido, Rep. of Korea

[73] Assignee: Hyundai Electronics Industries Co., Ltd., Kyoungkido, Rep. of Korea

[21] Appl. No.: 605,691

[22] Filed: Feb. 22, 1996

[30]     Foreign Application Priority Data

Feb. 24, 1995 [KR]  Rep. of Korea ................... 1995-3727

[51] Int. Cl.⁶ ................................................. H01L 21/76
[52] U.S. Cl. .............................. 437/61; 437/89; 437/160; 437/924
[58] Field of Search ....................... 437/61, 74, 89, 437/90, 160, 924; 148/DIG. 11

[56]     References Cited

U.S. PATENT DOCUMENTS 5,256,591  10/1993  Jun .

FOREIGN PATENT DOCUMENTS

| 57-66627 | 4/1982 | Japan . |
|---|---|---|
| 58-93220 | 6/1983 | Japan . |
| 1-321629 | 12/1989 | Japan . |

*Primary Examiner*—George Fourson
*Attorney, Agent, or Firm*—Jacobson, Price, Holman & Stern, PLLC

[57]     ABSTRACT

The present invention provides a method for forming a field oxide layer without the use of the LOCOS process. Accordingly, the present invention provides a superior effect capable of increasing the active region and improving the integration of semiconductor devices, preventing the bird's beak from being generated. Also, in the present invention, since the width of the field oxide layer is the same as that of a spacer on the sidewall of the insulating layer, the area of the field oxide layer is minimized.

16 Claims, 5 Drawing Sheets

METHOD FOR FORMING ISOLATED REGIONS IN A SEMICONDUCTOR DEVICE

BACKGROUND OF THE INVENTION

1. Field of the Invention

The present invention relates to a method for forming an isolation in a semiconductor device, and more particularly to increasing the active region in higher integrated circuits by diminishing the bird's beak.

2. Description of the Prior Art

Generally, a field oxide layer in integrated circuits has been commonly formed by using the LOCOS(local oxidation of silicon) process. However, the LOCOS process, which involves increasing the size of the bird's beak, causes a decrease of the active regions in semiconductor devices.

A conventional method for forming a field oxide layer will be described below in detail, referring FIG. 1.

First, FIG. 1 shows the PBL(polysilicon buffered LOCOS) process which can more diminish the bird's beak.

As shown in FIG. 1, a pad oxide layer 12 is formed on a silicon substrate 11. Also, a polysilicon layer 13, a nitride layer 14 and a photoresist layer (not shown) are in order formed on the pad oxide layer 12. After defining a field region using a predetermined photomask, the portions of the nitride layer 14 and the polysilicon layer 13 are etched such that a portion of the silicon substrate 11 is exposed, and a field oxide layer 15 is formed in the exposed silicon substrate 11 by the thermal oxidation process.

However, when the thermal oxidation process is applied to the exposed silicon substrate 11 so as to form the field oxide layer, a bird's beak is formed along the interface between the polysilicon layer 13 and the silicon substrate 11 in spite of the polysilicon layer's consumption. Since the increase of the size of the bird's beak causes the diminution of the active region of the semiconductor device, it is very difficult to highly integrate the devices.

SUMMARY OF THE INVENTION

An object of the present invention is to provide an isolation method for forming higher integrated circuits by increasing the area of the active region of the semiconductor devices.

In accordance with an aspect of the present invention, there is provided a method for isolating a semiconductor device, comprising the steps of: forming a first insulating layer exposing a field region of a substrate; forming a transition metal spacer on said substrate and on the sidewall of said first insulating layer; forming a second insulating layer on the entire resultant structure; diffusing ions of said transition metal spacer into said substrate by thermally treating said substrate; polishing said second insulating layer until said transition metal spacer is exposed, a portion thereof remaining not to be removed; forming a trench in said substrate by removing said transition metal spacer and ion-diffused substrate under said transition metal spacer; forming a third insulating layer on the entire resultant structure, filling up the said trench; forming a photoresist pattern on said third insulating layer and on said field region; etching said third insulating layer using said photoresist pattern as an etching barrier; exposing a portion of said substrate by removing said photoresist pattern and said first insulating layer; and forming epitaxial layers on said exposed substrate as active regions.

In accordance with another aspect of the present invention, there is provided a method for isolating a semiconductor device, comprising the steps of: forming a first insulating layer exposing a portion of a substrate; forming a transition metal spacer on said substrate and on the sidewall of said first insulating layer; forming a second insulating layer on the entire resultant structure; diffusing ions of said transition metal spacer into said substrate by thermally treating said substrate; polishing said second insulating layer such that said transition metal spacer is exposed, a portion thereof remaining not to be removed; forming a trench in said substrate by removing said transition metal spacer and ion-diffused substrate under said transition metal spacer; forming a third insulating layer on the entire resultant structure, filling up the said trench; polishing the stacked layers until said transition metal spacer is overall exposed, performing the planarization process; exposing a portion of said substrate by removing said second insulating layer and said first insulating layer which remain not to be removed, such that said substrate is exposed; and forming epitaxial layers on said exposed substrate as active regions.

BRIEF DESCRIPTION OF THE DRAWINGS

Other objects and aspects of the invention will become apparent from the following description of embodiments with reference to the accompanying drawings, in which.

DESCRIPTION OF THE PREFERRED EMBODIMENT

Hereinafter, an embodiment of the present invention will be described bellow, referring FIGS. 2A to 2F.

Figure 1:
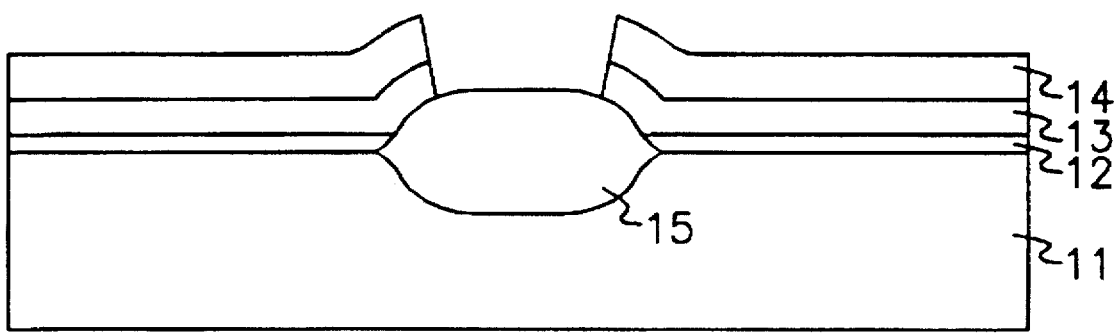
FIG. 1 is a cross-sectional view illustrating a conventional field oxide layer formed by the PBL process.
Figure 2A:
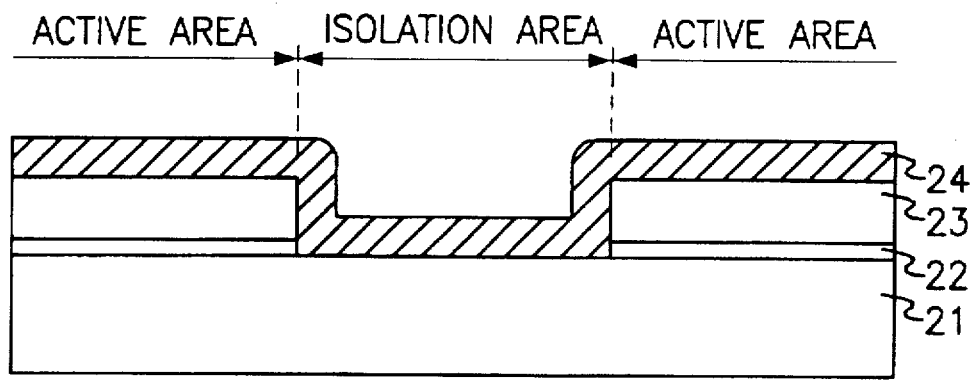
FIGS. 2A to 2F are Cross-sectional views illustrating a field oxide layer in accordance with an embodiment of the present invention.

As shown in FIG. 2A, a pad oxide layer 22 and a nitride layer 23 are in order deposited on a silicon substrate 21 to a thickness of 100~200Å and 1000~1300Å, respectively. A portion of the silicon substrate 21 is exposed by selectively etching the nitride layer 23 and the pad oxide layer 22 using the mask having a field pattern. A transition metal 24, such as W, Ti, Ta and Nb, is deposited to a thickness of about 1000Å on the entire resultant structure.

Figure 2B:
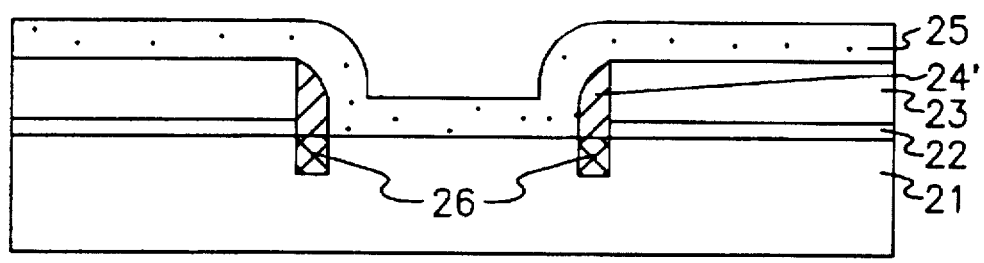

As shown in FIG. 2B, a transition metal spacer 24' is formed at the sidewall of the nitride layer 23 and the pad oxide layer 22 by applying the isotropic etching process to the transition metal 24, and a nitride layer of about 1000~1500Å in thickness is deposited on the entire resultant structure. Ions of the transition metal 24 diffuse into the silicon substrate 21 with thermal treatment of the wafer at a temperature of 900°–1000° C., and then a silicide layer 26 is formed in the silicon substrate 21.

Figure 2C:
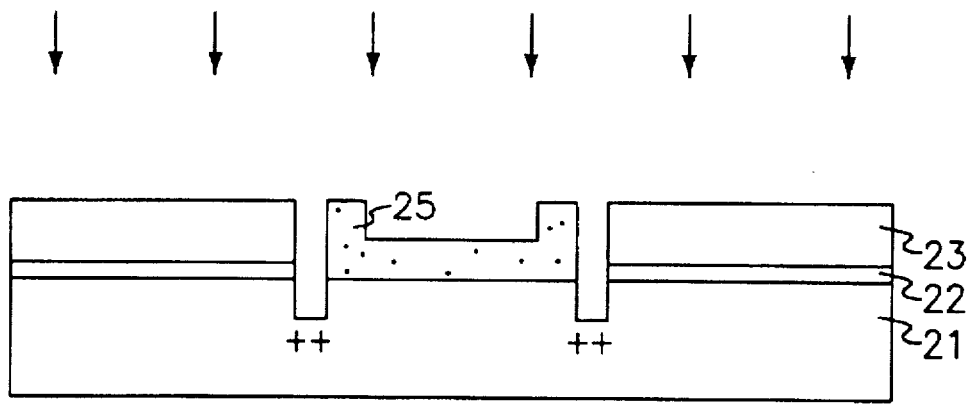

As shown in FIG. 2C, the upper structure is removed from the wafer by the chemical and mechanical polishing until the transition metal spacer 24' is exposed. After removing the transition spacer 24' and the silicide layer 26 using a mixed solution of $HNO_3$ with HF, the channel stop ion implantation process is performed to increase the isolation effect. For example, $BF_2$ ions are implanted into the exposed substrate under 10~50 KeV and $1\times10^{12}$~$1\times10^{18}$ atoms/$cm^2$.

Figure 2D:
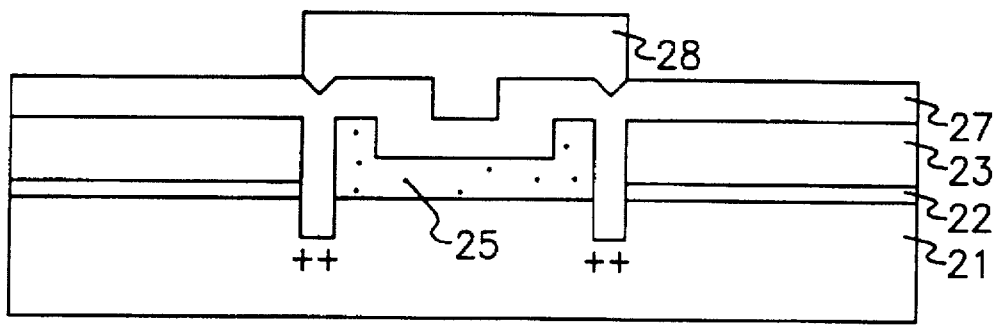

As shown in FIG. 2D, a tetraethoxysilane (TEOS) layer 27 of about 1000~2000Å in thickness is deposited on the entire resultant structure and a photoresist pattern 28 is formed on the TEOS layer 27. Also, the photoresist pattern 28 is formed by the photomask opposite to the photomask used for selectively etching the nitride layer 23 and the pad oxide layer 22 in FIG. 2A. That is to say, if the photoresist layer used for forming the filed region in FIG. 2A is positive and the photoresist pattern 28 in FIG. 2D is negative, the same photomask can be used in FIG. 2A and 2D.

Figure 2E:
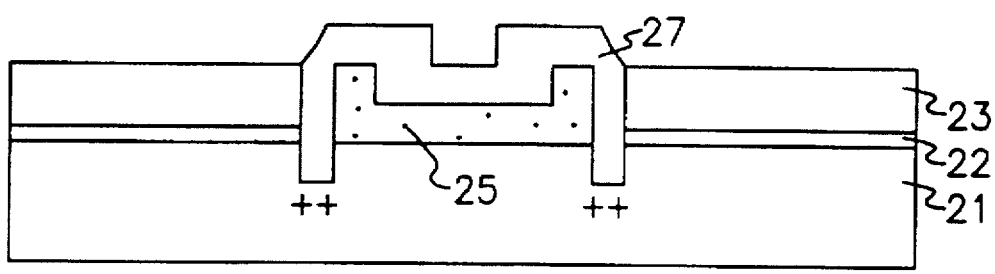

Next, as shown in FIG. 2E, the TEOS layer 27 is wet-etched using the photoresist layer 28 as a etching barrier.

Figure 2F:
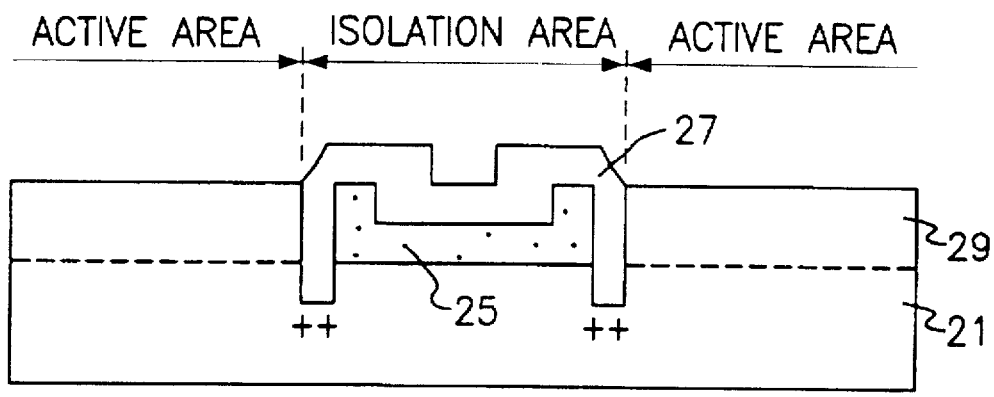

Finally, as shown in FIG. 2F, the nitride layer 23 on the pad oxide layer 22 is removed by a phosphoric acid and the pad oxide layer 22 is removed by using the isotropic etching process such that the active region of the silicon substrate 21 is exposed. An expitaxial layer 29 being formed on the exposed silicon substrate 21, the nitride layer 25 and the TEOS layer 27 act as a field oxide layer, and the expitaxial layer 29 acts as an active region.

Another embodiment of the present invention will be described bellow referring to FIGS. 3A to 3F.

Figure 3A:
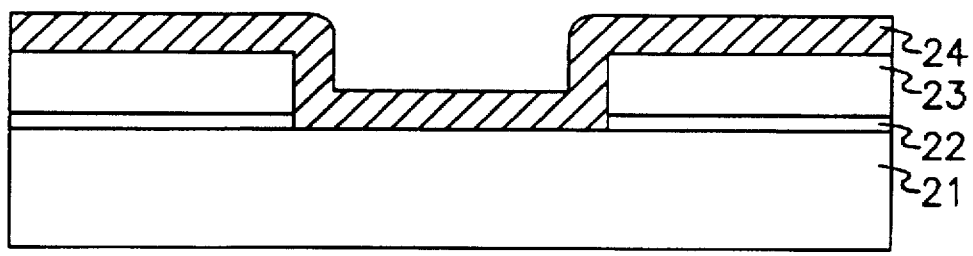
FIGS. 3A to 3F are cross-sectional views illustrating a field oxide layer in accordance with another embodiment of the present invention.
Figure 3B:
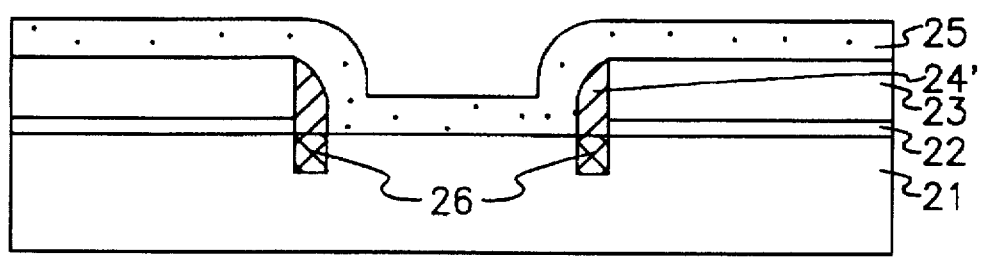
Figure 3C:
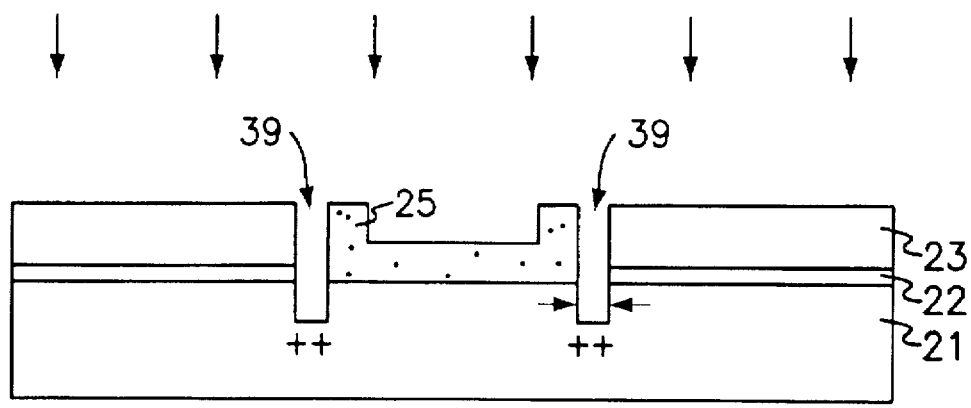

First, since the structures shown in FIGS. 3A to 3C are formed by the same methods that are illustrated in FIGS. 2A to 2C, the detailed description will be not described, and the same reference numerals refer to the same elements in the FIGS. 2A to 2C and FIGS. 3A to 3C.

However, it is noted that, in FIG. 3A, all areas of the silicon substrate 21 exposed by selectively etching the nitride layer and the pad oxide layer 22 are not formed as a field oxide region. That is, trenches 39, which are formed by removing the transition metal spacer 24' and the silicide layer 26, contributes to the formation of the field oxide layer. With respect to the field region, it will be described in detail in FIG. 3F.

Figure 3D:
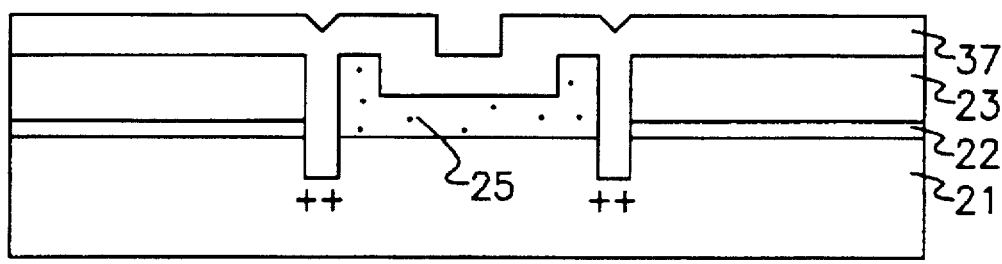

As shown in FIG. 3D, after implanting ions into the silicon substrate 21 to increase an isolation effect as shown in FIG. 3C, a TEOS layer 37 is deposited on the entire resultant structure, filling up the trenches 39.

Figure 3E:
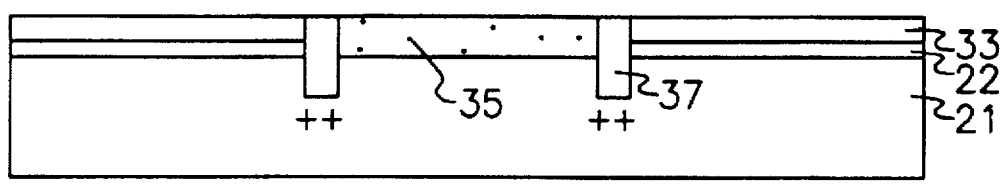

Next, as shown in FIG. 3E, the upper portion of the resultant structure is removed by the chemical and mechanical polishing until the nitride layer 35 is exposed. At this time, the vertical portion of the nitride layer 35 is removed and a nitride layer 33, which is a part of the nitride 23, remains on the pad oxide layer 22, the planarization process being performed.

Figure 3F:
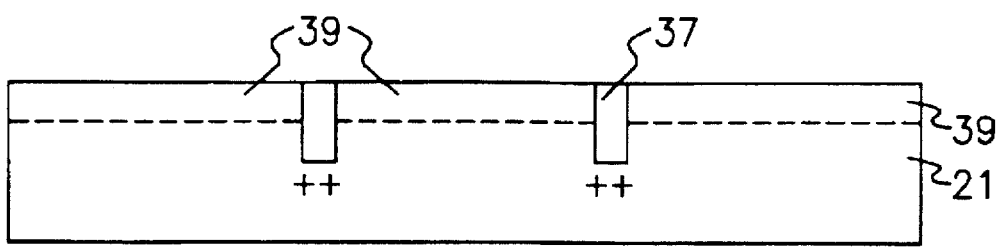

Finally, as shown is FIG. 3F, the nitride layer 33 on the pad oxide layer 22 is removed by a phosphoric acid and the pad oxide layer 22 is removed by the isotropic etching process such that the active region of the silicon substrate 21 is exposed. Accordingly, an expitaxial layer 39 being formed on the exposed silicon substrate 21 acts as an active region. Also, since the expitaxial layer 39 is formed on the silicon substrate 21 positioned between the two parts into which the TEOS layer 37 are separated, the area of the active region in FIG. 3F is broader than that in FIG. 2F.

As apparent from above description, the present invention provides a superior effect capable of increasing the active region and improving the integration of the semiconductor devices, preventing the bird's beak from being generated. Also, in another embodiment of the present invention, since the width of the field oxide layer is the same as that of the transition metal spacer, the area of the field oxide layer is minimized.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for isolating a semiconductor device, comprising the steps of:

forming a first insulating layer exposing a field region of a substrate;

forming a transition metal spacer on said substrate and on the sidewall of said first insulating layer;

forming a second insulating layer on the entire resultant structure;

diffusing ions of said transition metal spacer into said substrate by thermally treating said substrate;

polishing said second insulating layer until said transition metal spacer is exposed, a portion thereof remaining not to be removed;

forming a trench in said substrate by removing said transition metal spacer and ion-diffused substrate under said transition metal spacer;

forming a third insulating layer on the entire resultant structure, filling up the said trench;

forming a photoresist pattern on said third insulating layer and on said field region;

etching said third insulating layer using said photoresist pattern as an etching barrier;

exposing a portion of said substrate by removing said. photoresist pattern and said first insulating layer; and forming epitaxial layers on said exposed substrate as active regions.

2. A method in accordance with claim 1, wherein the step of forming a trench in said substrate further comprises the step of implanting channel stop ions into said trench.

3. A method in accordance with claim 1, wherein said first insulating layer is made of a pad oxide layer and a nitride layer.

4. A method in accordance with claim 1, wherein said substrate is a silicon substrate.

5. A method in accordance with claim 4, wherein said ions diffused into said substrate from said transition metal spacer forms a silicide layer in said silicon substrate.

6. A method in accordance with claim 1, wherein said second insulating layer is a nitride layer.

7. A method in accordance with claim 1, wherein said third insulating layer is a tetraethoxysilane (TEOS) layer.

8. A method in accordance with claim 1, wherein said transition metal is one of W, Ti, Ta, Mo or Nb.

9. A method for isolating a semiconductor device, comprising the steps of:

forming a first insulating layer exposing a portion of a substrate;

forming a transition metal spacer on said substrate and on the sidewall of said first insulating layer;

forming a second insulating layer on the entire resultant structure;

diffusing ions of said transition metal spacer into said substrate by thermally treating said substrate;

polishing said second insulating layer such that said transition metal spacer is exposed, a portion thereof remaining not to be removed;

forming a trench in said substrate by removing said transition metal spacer and ion-diffused substrate under said transition metal spacer;

forming a third insulating layer on the entire resultant structure, filling up the said trench;

polishing the stacked layers until said transition metal spacer is overall exposed, performing the planarization process;

exposing a portion of said substrate by removing said second insulating layer and said first insulating layer, which remain not to be removed, such that said substrate is exposed; and forming epitaxial layers on said exposed substrate as active regions.

10. A method in accordance with claim 9, wherein the step of forming a trench in said substrate further comprises the step of implanting channel stop ions into said trench.

11. A method in accordance with claim 9, wherein said first insulating layer is made of a pad oxide layer and a nitride layer.

12. A method in accordance with claim 9, wherein said substrate is a silicon substrate.

13. A method in accordance with claim 12, wherein said ions diffused into said substrate from said transition metal spacer forms a silicide layer in said silicon substrate.

14. A method in accordance with claim 9, wherein said second insulating layer is a nitride layer.

15. A method in accordance with claim 9, wherein said third insulating layer is a tetraethoxysilane (TEOS) layer.

16. A method in accordance with claim 9, wherein said transition metal is one of W, Ti, Ta, Mo or Nb.

* * * * *